(12) United States Patent
Shibagaki

(10) Patent No.: US 6,824,621 B2
(45) Date of Patent: Nov. 30, 2004

(54) SINGLE WAFER TYPE SUBSTRATE CLEANING METHOD AND APPARATUS

(75) Inventor: Kizoh Shibagaki, Kunitachi (JP)

(73) Assignee: S.E.S. Company Limited, Tokyo (JP)

( * ) Notice: Subject to any disclaimer, the term of this patent is extended or adjusted under 35 U.S.C. 154(b) by 251 days.

(21) Appl. No.: 09/948,800

(22) Filed: Sep. 10, 2001

(65) Prior Publication Data

US 2002/0195128 A1 Dec. 26, 2002

(30) Foreign Application Priority Data

Jun. 22, 2001 (JP) .......................................... 2001-189794

(51) Int. Cl.[7] .............................. B08B 3/00; B08B 3/02; B08B 3/04; B08B 3/08
(52) U.S. Cl. ............................ 134/26; 134/33; 134/36; 134/95.3; 134/153; 134/902
(58) Field of Search .............................. 134/26, 33, 36, 134/95.3, 153, 902

(56) References Cited

U.S. PATENT DOCUMENTS

| 6,115,867 A | * | 9/2000 | Nakashima et al. ............ 15/77 |
| 6,239,038 B1 | * | 5/2001 | Wen ............................. 438/745 |
| 6,247,479 B1 | * | 6/2001 | Taniyama et al. .......... 134/95.2 |
| 2002/0179120 A1 | * | 12/2002 | Ono et al. ..................... 134/26 |

* cited by examiner

*Primary Examiner*—Zeinab EL-Arini
(74) *Attorney, Agent, or Firm*—Armstrong, Kratz, Quintos, Hanson & Brooks, LLP

(57) ABSTRACT

A single wafer type wet-cleaning technique for effectively preventing chemical fluids from flowing to the back face of a wafer when the back face thereof is wet-cleaned by chemical fluids, wherein purified water is injected and supplied to the back face of the wafer while a plurality of chemical fluids is sequentially supplied vertically from above to the wafer, which is rotatably supported, so that the purified water cleans the back face of the wafer and effectively prevents the chemical fluids from flowing to the back face of the wafer.

4 Claims, 7 Drawing Sheets

SINGLE WAFER TYPE SUBSTRATE CLEANING METHOD AND APPARATUS

BACKGROUND OF THE INVENTION

1. Field of the Invention

The invention relates to a single wafer type substrate cleaning method and a single wafer type substrate cleaning apparatus, more particularly to a single wafer type wet cleaning technique or system for applying a cleaning treatment to substrates such as semiconductor wafers one-by-one during the fabrication process, as well as certain devices such as electronic parts, and the like.

2. Prior Art

A so-called batch type wet cleaning system has been the principal method of cleaning substrates such as semiconductor wafers (hereinafter referred to simply as "Wafers"), whereby wafers stored in a carrier cassette are immersed in sequence in wet bench type cleaning baths arranged in series, or wafers are directly immersed in the cleaning baths through a transfer unit without being stored in a carrier cassette. However, semiconductor devices have reached the sub micron age, in that they are now micro-fabricated and highly integrated, such that the face of wafers has recently required a very high degree of cleaning density, and wafers which are not stored in a cassette have to be wet-cleaned individually in a sealed cleaning housing. To this end, a so-called single wafer type wet cleaning system intended to meet the requirement of a higher cleaning density has been developed and proposed.

Under the single wafer type wet cleaning system, wafers can be cleaned with the use of a simple and compact cleaning apparatus in a relatively clean atmosphere where particles and the like do not settle or remain on the face of the wafer. This system is therefore practical to use for small scale production.

Generally, under the single wafer type wet cleaning system, a cleaning treatment is applied to the front face, i.e., the upper side surface of the wafer by various chemical fluids in a predetermined order. In the process, the chemical fluids supplied flow to the back face of the wafer, thereby possibly contaminating the back face of the wafer. If the back face of the wafer is contaminated, the handling jig for the wafer, e.g., the robot hands of a schalar type robot, also become contaminated, and as a result, other wafers which are handled by the same robot hands naturally also get contaminated.

For the foregoing reason, a technique for preventing the chemical fluid (s) from flowing to the back face of the wafer has become immensely desirable, and the device shown in FIG. 7 providing such technique has been proposed under Japanese Patent Laid Open Publication No. 2000-343054 (hereinafter referred to as the "Chemical Fluid Flowing Around Prevention Technique").

Under the Chemical Fluid Flowing Around Prevention Technique, chemical fluid is supplied to the front face Wa of a wafer W while it is rotatably supported by a wafer rotary section "a", and simultaneously a certain gas is supplied from an annular nozzle "b" under the wafer W so as to float the wafer W while it is prevented from sliding sideways by a supporter member "c", so that the chemical fluid which has flowed from the front face Wa of the wafer W to the back face Wb thereof is blown off as shown in FIG. 7(B).

However, the system of blowing off the chemical fluid through the supply of a gas prevents the back face Wb of the wafer W from being cleaned, thereby making it difficult to completely avoid contamination of the wafer. Accordingly, a further improvement of the system is desirable.

SUMMARY OF THE INVENTION

The present invention has been made in view of the aforementioned problem, and it is the object of the invention to provide a single wafer type wet-cleaning technique capable of effectively preventing chemical fluids from flowing to the back face of the wafer, which is not stored in a cassette, when the front face thereof is wet-cleaned by chemical fluids in a sealed cleaning chamber.

To achieve the above objective, the single wafer type cleaning method of the present invention for cleaning wafers which are not stored in a cassette, one-by-one in a sealed cleaning housing, comprises a cleaning step whereby various chemical fluids are sequentially supplied from above to the front face of each wafer, which is rotatably supported by the wafer rotary means in the cleaning housing, originating from supply nozzles located on the upper side of the cleaning housing, while purified water is injected and supplied to the back face of each wafer at the same time from a supply nozzle located on the lower side of the cleaning housing.

In the preferred embodiment, when purified water is injected and supplied in a radial direction from the lower side supply nozzle to the central portion of the back face of each wafer, which is rotatably supported by the wafer rotary means in the cleaning housing, the injected purified water cleans the back face of each wafer while it flows in a radial direction to the back face of the wafer owing to the centrifugal force generated by the rotation of each wafer. In addition, the injection and supply of purified water from the lower side supply nozzle is intended to cause the wafer to float owing to the force of injection and to reach the outer peripheral portion of the back face of the wafer owing to the centrifugal force generated by the rotation of the wafer.

The single wafer type cleaning apparatus of the invention is suitable for carrying out the foregoing cleaning method, and is designed to clean wafers, which are not stored in a cassette, one by one in a sealed cleaning housing, wherein the cleaning apparatus comprises (1) a wafer rotary means for supporting and rotating each wafer in the cleaning housing in the horizontal position, (2) a cleaning chamber provided at the outer peripheral portion of the wafer rotary means for forming a cleaning treatment space to clean each wafer which is rotatably supported by the wafer rotary means, (3) a chemical fluid supply means for supplying chemical fluids to the front face of each wafer which is rotatably supported by the wafer rotary means, (4) a purified water supply means for supplying purified water to the back face of each wafer which is rotatably supported by the wafer rotary means, wherein several chemical fluids are sequentially supplied from the chemical fluid supply means to the front face of each wafer from above, while the wafer is rotatably supported by the wafer rotary means, and at the same time purified water is injected and supplied from the purified water supply means to the back face of each wafer.

In the preferred embodiment of the invention, the purified water supply means has an injection nozzle for injecting and supplying purified water to the back face of the wafer which is rotatably supported by the wafer rotary means, wherein the injection nozzle is directed upward and located on the upper end portion of the rotatable rotary shaft of the wafer rotary means and can communicate with the purified water supply source. Further, the injection nozzle comprises a storage section communicating with the first and second passages and a number of injection ports located in the storage section.

Under the single wafer type cleaning system of the invention, several chemical fluids are sequentially supplied from the upper side supply nozzle to the front face of each wafer which is rotatably supported by the wafer rotary means while purified water is injected and supplied from the lower side supply nozzle to the back face of each wafer while the front face of the wafer is being cleaned by chemical fluids. As a result, it is possible to design a single wafer type wet-cleaning technique capable of effectively preventing the chemical fluids from flowing to the back face of each wafer when the front face of the wafer, which is not stored in a cassette, is cleaned by the chemical fluids in the sealed cleaning chamber. In the process, the chemical fluids that are supplied to the front face of each wafer flow toward the outer peripheral portion of the face of the wafer owing to the centrifugal force generated by the rotation of the wafer and are therefore prone to flow to the back face of the wafer. Accordingly, when the front face of each wafer is cleaned by chemical fluids, and purified water is injected and supplied to the back face of the wafer, the chemical fluids flow in a radial direction along the back face of the wafer owing to the centrifugal force generated by the rotation of the wafer, thereby cleaning the back face of the wafer. The purified water thus provides a sealing function relative to the chemical fluids which are prone to flow from the front face of the wafer to the back face thereof, and in the process effectively prevents the back face of the wafer from being contaminated by the chemical fluids.

BRIEF DESCRIPTION OF THE DRAWINGS

FIGS. 7(A) and 7(B) are views showing the construction for preventing the chemical fluids from flowing to the back face of each wafer in the conventional single wafer type substrate cleaning apparatus, wherein FIG. 7(A) is a front sectional view of the same construction and FIG. 7(B) is an enlarged front sectional view showing the mechanism for preventing the chemical fluids from flowing to the back face of each wafer by the injection and supply of a gas from the lower side annular nozzle in the construction of FIG. 7(A).

PREFERRED EMBODIMENT OF THE INVENTION

The preferred embodiment of the invention is described with reference to the attached drawings.

Figure 1:
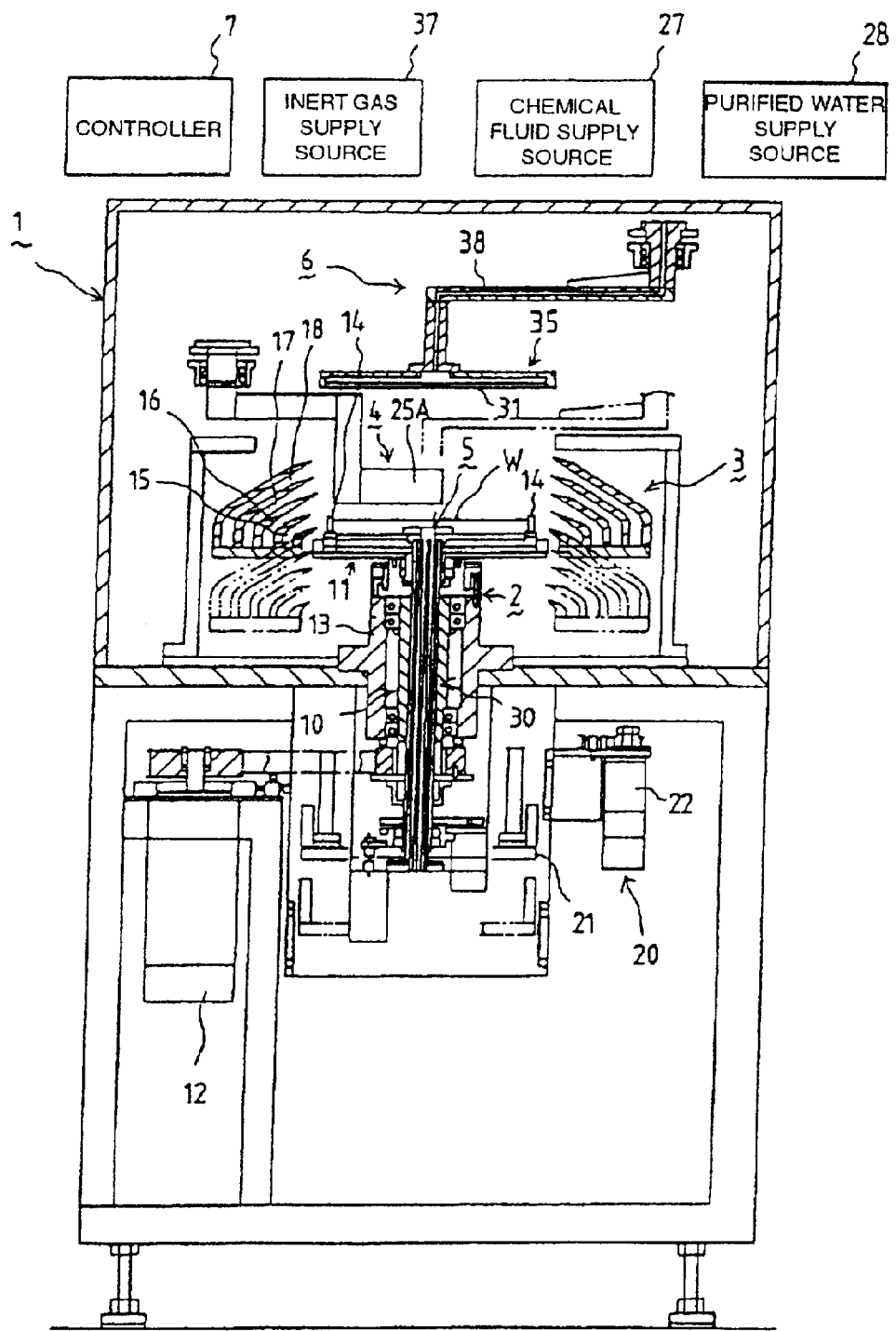
FIG. 1 is a front sectional view showing the internal structure of the single wafer type substrate cleaning apparatus according to the preferred embodiment of the invention.

A single wafer type wet-cleaning apparatus is illustrated in FIG. 1, wherein each wafer W, which is not stored in a cassette, is wet-cleaned individually in a sealed cleaning housing 1, and the sealable cleaning housing 1 comprises a wafer rotary section (wafer rotary means) 2 for rotatably supporting one wafer W in the horizontal position, a cleaning chamber 3 which is relatively vertically movable, a chemical fluid supply section (chemical fluid supply means) 4 for supplying chemical fluids to the front face Wa of the wafer, a purified water supply section (purified water supply means) 5, an inert gas supply section (inert gas supply means) 6 for supplying an inert gas for preventing oxidation, and a controller 7 for controlling these driving sections while interlocking mutually therewith as major components.

The cleaning housing 1 is sealable at the upper portion for the cleaning treatment and serves as a location for installing various unit driving sections at the lower portion disposed in the upper space. A closable wafer taking in-out port, not shown in detail, through which the wafer W is taken in or taken out in the upper space of the cleaning housing 1, is structured in such a way to secure airtightness and watertightness when it is closed.

The wafer rotary section 2 horizontally rotates a single wafer W while it supports the single wafer W in the horizontal position when the spin cleaning and spin drying treatments are applied thereto, and comprises a rotary shaft 10, a wafer supporting section 11 which is attached to and supported by the upper end portion of the rotary shaft 10 in the horizontal position, and a driving motor 12 for rotatably driving the rotary shaft 10.

The wafer supporting section 11 and the rotary shaft 10 are rotatably disposed at the center of the cleaning housing 1 via a bearing supporting cylinder 13 in a perpendicular position, and a single wafer W can be supported by the wafer supporting section 11 in the horizontal state.

Figure 2:
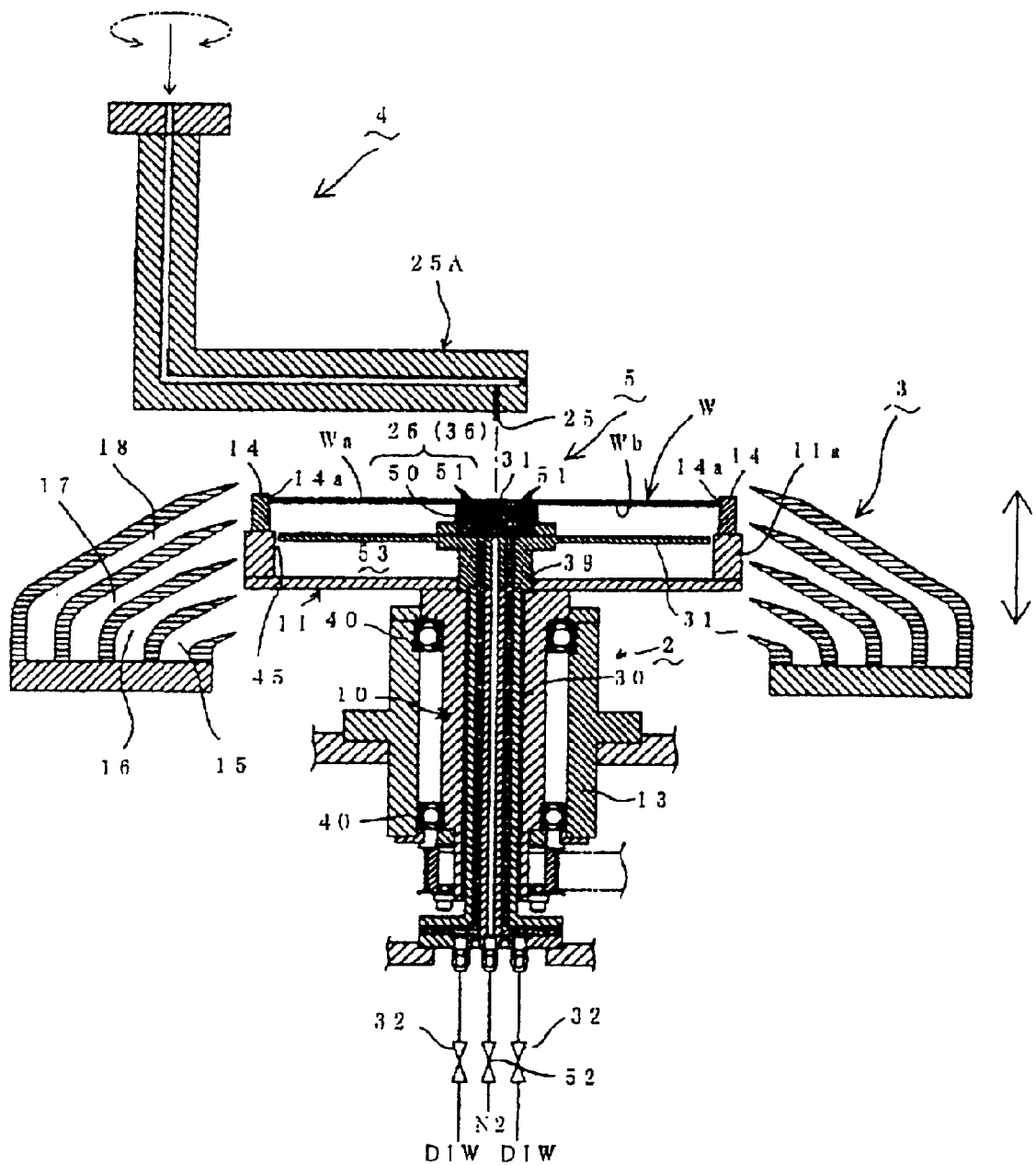
FIG. 2 is an enlarged sectional front view showing the locational relationship between the wafer rotary section, the cleaning housing and the chemical fluid supply section of the single wafer type substrate cleaning apparatus.
Figure 3:
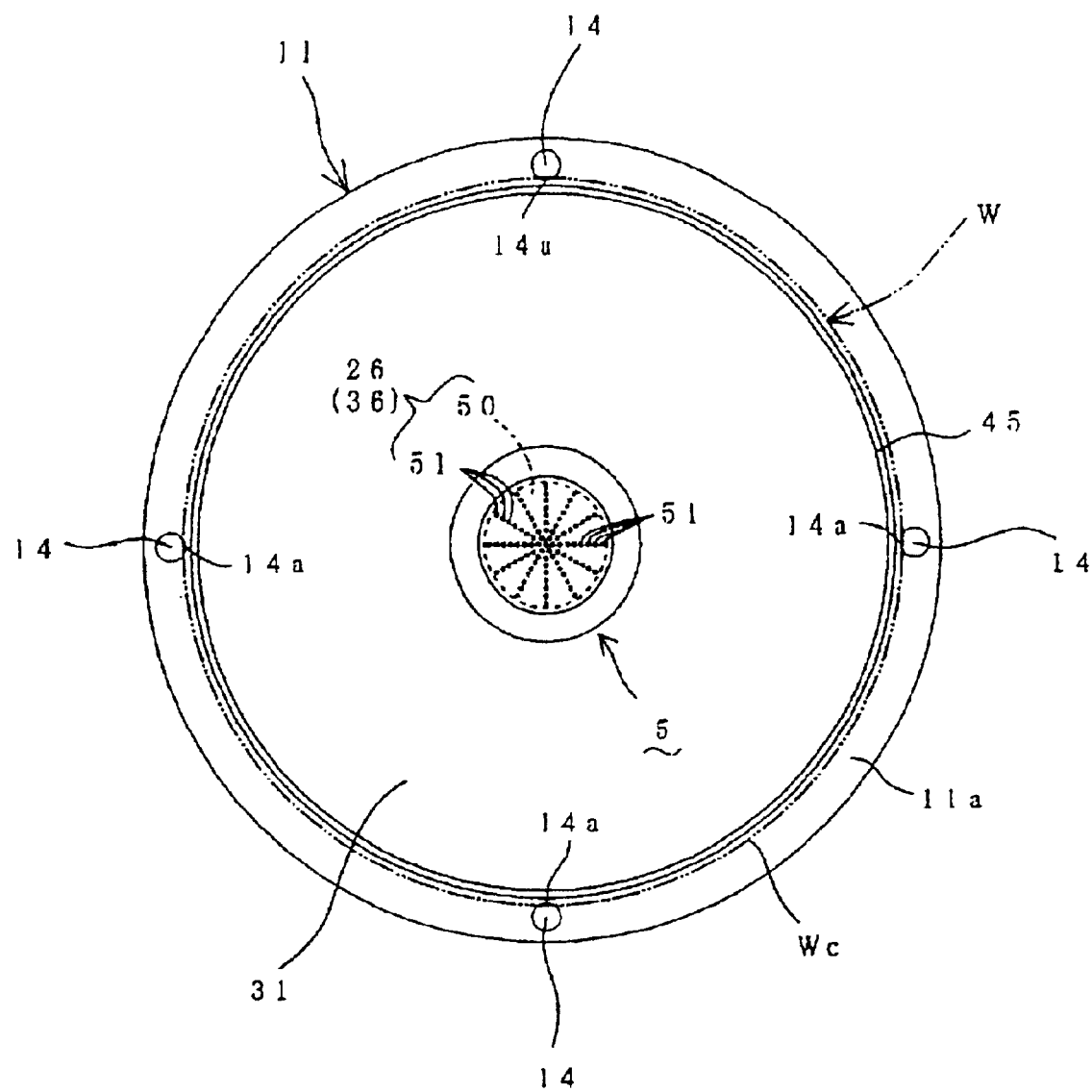
FIG. 3 is a front view showing the construction of the wafer rotary section and the lower side injection nozzle of the purified water supply section.
Figure 4:
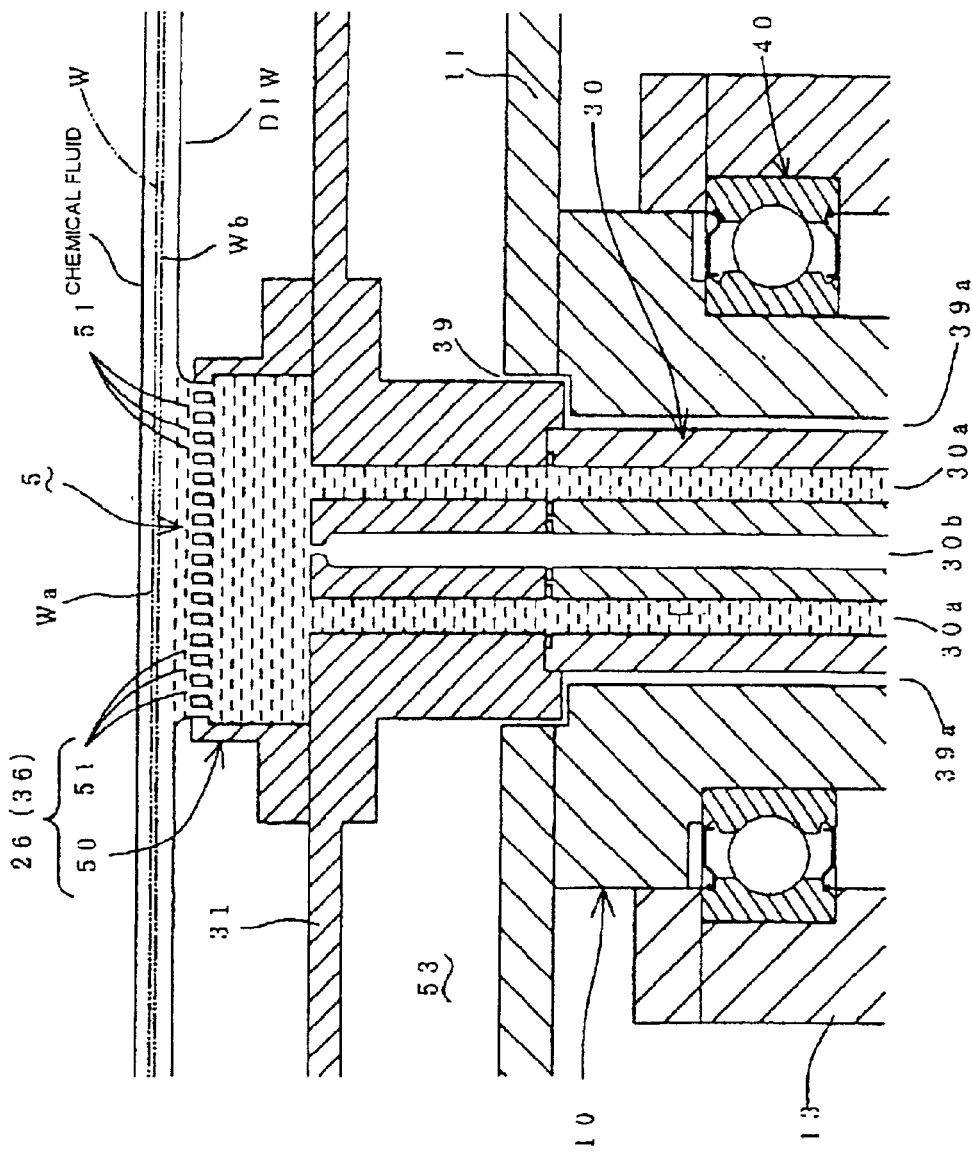
FIG. 4 is an enlarged front sectional view showing the construction of the wafer rotary section and the peripheral portion of the lower side injection nozzle of the purified water supply section.

In particular, the wafer supporting section 11 comprises a discoid body having annular wall section 11a which stands upright at its outer peripheral portion, as shown in FIGS. 2 and 3, and has a number of columnar supporters, 14, 14, . . . on the annular wall section 11a (four of which are shown in FIG. 4) for placing and supporting the wafer W on the peripheral portion of the upper face thereof.

These supporters 14, 14, . . . are circumferentially arranged on the wafer supporting section 11 at the same intervals as illustrated in FIGS. 2 and 3, and the inner peripheral portions of the tips thereof support the outer peripheral portion Wc of each wafer W to form supporting recesses 14a, 14a, . . . . The supporting recesses 14a, 14a, . . . of these supporters 14, 14, . . . are designed to have the same height, so that the peripheral portion of the wafer W is supported when it is placed thereon in the horizontal position.

Further, the supporting face of each supporting recess 14a has a configuration corresponding to the contour of the peripheral portion of the wafer W in cross section, and the peripheral edge corner section of each supporting recess can contact and support the square peripheral corner of the wafer W in cross section in a point contact state or line contact state.

As shown in FIGS. 1 and 2, the rotary shaft 10 is rotatably supported by the bearing supporting cylinder 13 in the standing position, and the lower end portion of the rotary shaft 10 is connected to the driving motor 12 so as to be rotatably driven by the driving motor 12 via a belt entrained therebetween so that the wafer supporting section 11 is rotated at a given speed of rotation. The speed of rotation of the rotary shaft 10 is set at low speed, e.g., 40–50 r.p.m. when the spin cleaning treatment is effected while it is set at high speed of approximately 3000 r.p.m. when the spin drying treatment is effected.

Further, the rotary shaft 10 comprises a hollow cylindrical body as illustrated, and a pipe 30 for the lower side nozzle 26 of the purified water supply section 5, described later, is disposed in the hollow section of the rotary shaft 10.

The cleaning chamber 3 is the section where the cleaning treatment is applied to the wafer W, and the inner diameter dimensions thereof are determined in connection with the wafer supporting section 11 of the wafer rotary section 2, described hereinbelow, and has a cleaning treatment space for the wafer W, which is rotatably supported by the wafer rotary section 2, at the outer periphery of the wafer rotary section 2.

In detail, the cleaning chamber 3 has plural stages of annular treatment baths 15 to 18 which are arranged vertically at the inner periphery thereof as shown in FIGS. 1 and 2, and is constructed to move up and down vertically relative to the wafer rotary section 2.

In the illustrated preferred embodiment, four stages of annular treatment baths 15 to 18 are arranged vertically and concentrically with the wafer W so as to surround the wafer W which is supported by the wafer supporting section 11 of the wafer rotary section 2.

The peripheral inner edges of the annular treatment baths 15 to 18 are arranged in the manner that annular gaps defined between these edges are set to have small intervals to such extent as would prevent the chemical fluids and the like from being leaked downward and at the same time do not contact the outer diameter edge of the wafer supporting section 11 of the wafer rotary section 2.

The cleaning chamber 3 is constructed to be movable up and down, i.e., vertically via an elevating guide (not shown), and has an elevating mechanism 20 capable of elevating relative to the wafer supporting section 11 of the wafer rotary section 2 by a given stroke.

The elevating mechanism 20 comprises a feed screw mechanism (not shown), which moves a supporting frame 21 for supporting the cleaning chamber 3 up and down, and a driving motor 22 for rotatably driving the feed screw mechanism.

Depending on the cleaning treatment step, the cleaning chamber 3 moves up and down vertically by a given stroke via the feed screw mechanism as the driving motor 22 is driven while interlocking with the operation of the wafer rotary section 2, described hereinbelow, so that any one of the annular treatment baths 15 to 18 for effecting the cleaning treatment step may be selected from a position of height relative to the wafer W which is supported by the wafer supporting section 11 of the wafer rotary section 2.

Drain sections, which communicate with the outside of the apparatus, are respectively provided in the four annular treatment baths 15 to 18 (not illustrated in detail). These drain sections discharge or collect for recycling the chemical fluids or the inert gas inside the annular treatment baths 15 to 18, in which they are structured to be opened only when the cleaning treatment is effected and to be closed when the cleaning treatment is effected in the other treatment baths.

The chemical fluid supply section 4 supplies the chemical fluids to the face Wa of the wafer W which is rotatably supported by the wafer rotary section 2, and it has upper side supply nozzles 25 as its main components for supplying the chemical fluids to the front face of the wafer W from above.

In detail, the upper side supply nozzles 25 consist of injection nozzles designed to inject and supply the chemical fluids to the front face of the wafer W, whereby the number of nozzles to be employed depends on the kind of chemical fluids to be supplied, and the upper side supply nozzles can communicate with the chemical fluid supply source 27 provided outside the cleaning housing 1.

In the illustrated embodiment, the upper side injection nozzles 25 are located in the injection nozzle section 25A which integrally consists of a plurality of nozzle sections, and the injection nozzle section 25A is constructed in such a manner that it may be turned horizontally in a downward direction at the upper portion of the cleaning housing 1, and it is drivably connected to a driving motor capable of being swung(not shown).

The injection nozzles to be utilized depends on the kind of cleaning fluids to be supplied. In particular, these upper side injection nozzles 25, 25, . . . (only one is illustrated in FIG. 2) which are provided in the injection nozzle section 25A (not shown), are intended to serve as supply ports for an APM fluid, purified water and a DHF fluid, described hereinbelow.

The upper side injection nozzles 25 or the injection nozzle section 25A are constructed in such a way as to inject and supply given chemical fluids to the front face Wa of the wafer W which is rotatably supported by the wafer supporting section 11 of the wafer rotary section 2 in the horizontal position while it is turned horizontally from the outer region toward the center thereof or when it stands still after being turned horizontally.

The chemical fluid supply source 27 is the supply source for supplying cleaning chemical fluids to the upper side injection nozzles 25 and has two chemical fluid systems, as shown in the illustrated embodiment, either of which may be selected to clean the wafer W. One system employs an APM ($NH_4OH+H_2O_2$; $H_2O$) fluid while the other system uses a DHF ($HF+H_2O$) fluid, whereas annular treatment baths 15 to 18 in the cleaning chamber 3 correspond with these two chemical fluid supply systems, such that, the lowermost stage treatment bath 15 is used for the cleaning step by APM fluid, the third upper stage treatment bath 16 is used for the cleaning step by DHF fluid, the second upper stage treatment bath 17 is used for the rinsing step by purified water, and the uppermost stage treatment bath 18 is used for the spin drying step.

Further, the chemical fluid supply source 27 is constructed to select and effect the cleaning steps using any of the following recipes of chemical fluids: i) APM+DHF+($O_3$+DIW)+DRY; ii) APM+DHF +DRY; iii) APM+DRY, DHF+DRY or the like with the cooperation of the inert gas supply source 37 described hereinbelow.

In particular, the upper side injection nozzles 25 are controlled in such a manner that they subsequently supply a plurality of chemical fluids from above to the front face Wa of each wafer W, which is rotatably supported by the wafer rotary section 2, in accordance with the recipe which was selected from any of the abovementioned combinations i) to iii), thereby cleaning the wafer W while purified water is supplied from the lower side supply nozzle 26 in a series of cleaning steps.

The inert gas supply section 5 supplies purified water to the back face Wb (lower surface in the drawings) of each wafer W which is rotatably supported by the wafer rotary section 2 and comprises as its main component a lower side supply 26 for supplying purified water to the back face Wb of the wafer W from the lower side.

In detail, the lower side injection nozzle 26 comprises an injection nozzle for supplying purified water to the back face Wb of the wafer W, and it can communicate with the purified water supply source 28 which is provided outside the cleaning housing 1.

In the illustrated embodiment, the lower side injection nozzle 26 is provided at the upper end portion of the rotatable rotary shaft 10 of the wafer rotary section 2, and it is directed upward in a fixed position relative to the back face Wb of the wafer W which is rotatably supported by the wafer rotary section 2. The lower side injection nozzle 26 comprises a storage section 50, and a plurality of injection ports 51, 51, . . . which are provided in the storage section 50, wherein the storage section 50 can communicate with the purified water supply source 28 via the pipe 30 which is disposed inside the rotary shaft 10.

Figure 5A:
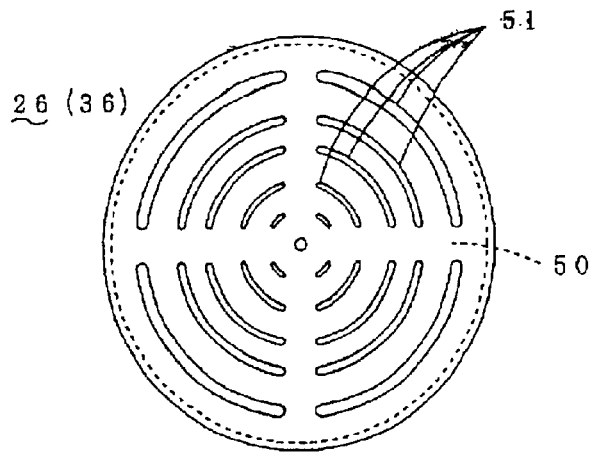
FIGS. 5(a), 5(B) and 5(C) are enlarged plan views showing modified examples of the arrangement of injection ports of the lower side injection nozzle.
Figure 5B:
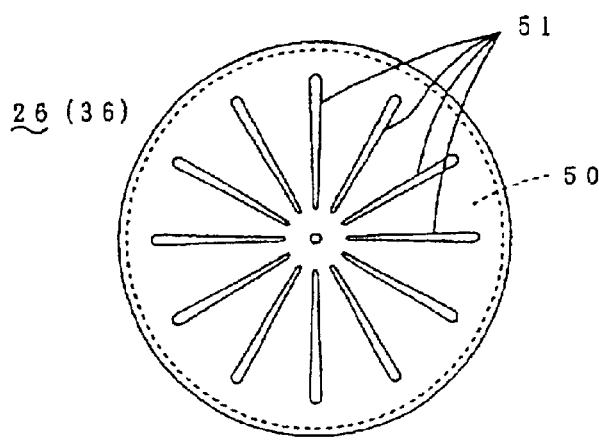
Figure 5C:
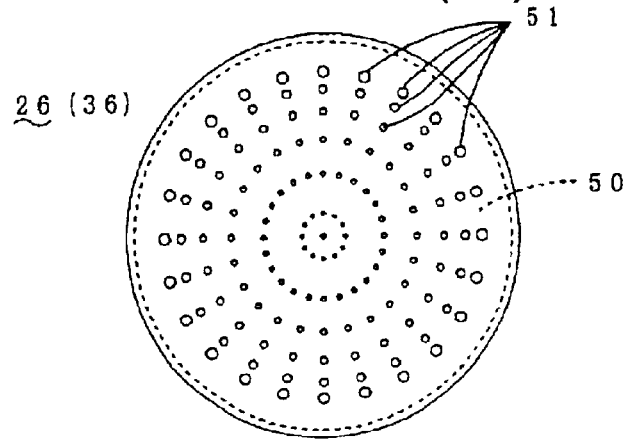

The injection ports 51, 51, . . . are linearly arranged to extend in a radial direction as shown in FIG. 3 according to the illustrated embodiment, but they may be arranged in the manner as illustrated in FIGS. 5(A), 5(B) and 5(C).

The arrangement of the injection ports 51, 51, . . . as shown in FIGS. 5(A), 5(B) and 5(C) is such that the sum of the areas of the openings of the injection ports 51, 51, . . . becomes larger at the outer region of the face of each wafer than at the center thereof as they direct toward the outer region of the wafer. Such an arrangement is very effective if purified water supplied in a radial direction from the lower side injection nozzle 26 to the center of the back face Wb of the wafer W in a radial direction flows to the back face Wb of the wafer W owing to the centrifugal force generated by the rotation of the wafer W.

The injection ports 51, 51, . . . shown in FIG. 5(A) are in the form of circular arc slits, and the length and width dimensions thereof are designed to be larger at the outer region of the wafer W than at the center thereof as the injection openings direct toward the outer regions of the wafer W. Further, the injection ports 51, 51, . . . shown in FIG. 5(B) are in the form of radially extended slits, and the width dimensions thereof are designed to be larger at the outer region of the wafer W than at the center thereof as the injection openings direct toward the outer regions of the wafer W. Further, the injection ports 51, 51, . . . shown in FIG. 5(C) are in the form of circular openings which are arranged circumferentially and radially at prescribed intervals, and the diameter dimensions thereof are designed to be larger at the outer region of the wafer W than at the center thereof as the injection openings direct toward the outer regions of the wafer W.

The pipe 30 vertically penetrates the hollow section of the rotary shaft 10 composed of a hollow cylindrical body, and is firmly disposed on the rotary shaft 10 by a supporting mechanism (not shown), while it does not contact the rotary shaft 10.

A discoid drainage receiver 31 is integrally provided on the upper end portion of the pipe 30, and the lower side injection nozzle 26 is provided at the center of the drainage receiver 31. The storage section 50 of the lower side injection nozzle 26 communicates with several purified water supply passages (through a pipe for supplying purified water) 30a, 30a, . . . which are provided by penetrating the interior of the pipe 30.

The upper face of the drainage receiver 31 is disposed to be flush with the upper face of the annular wall section 11a of the wafer supporting section 11, and the outer diameter edge of the drainage receiver does not contact the inner diameter face of the annular wall section 11a. An annular gap 45 defined between the outer diameter edge of the drainage receiver 31 and the inner diameter face of the annular section 11a is designed to be very small to such extent as would prevent the chemical fluids and the like from leaking downward.

Further, the purified water supply passages 30a, 30a, . . . can selectively communicate with the purified water supply source 28 via the directional control valve 32 at the lower end portion of the pipe 30.

Purified water which is supplied from the purified water supply source 28 and is injected in a radial direction through the lower side injection nozzle 26 to the center of the back face Wb of the wafer W, which is rotatably supported by the wafer supporting section 11 of the wafer rotary section 2, then flows in a radial direction along the back face Wb of the wafer W owing to the centrifugal force generated by the rotation of the wafer W.

The supply of purified water from the purified water supply source 28 and the injection of the same through the lower side injection nozzle 26 in the illustrated embodiment has the effect of floating the wafer W which is rotatably supported by the wafer supporting section 11 of the wafer rotary section 2 and reaches the outer peripheral portion of the wafer W along the back face Wb owing to the centrifugal force generated by the rotation of the wafer W.

The purified water supply source 28 is drivably controlled such that the supply of purified water from the lower side injection nozzle 26 is synchronized with the cleaning of the front face Wa of the wafer W by chemical fluids from the chemical fluid supply section 4. In other words, if purified water is injected and supplied to the back face Wb of the wafer W from the lower side injection nozzle 26 in accordance with the foregoing determined conditions, the purified water cleans the back face Wb of the wafer W and at the same time prevents the chemical fluids from flowing to the back face Wb of the wafer W.

Figure 6:
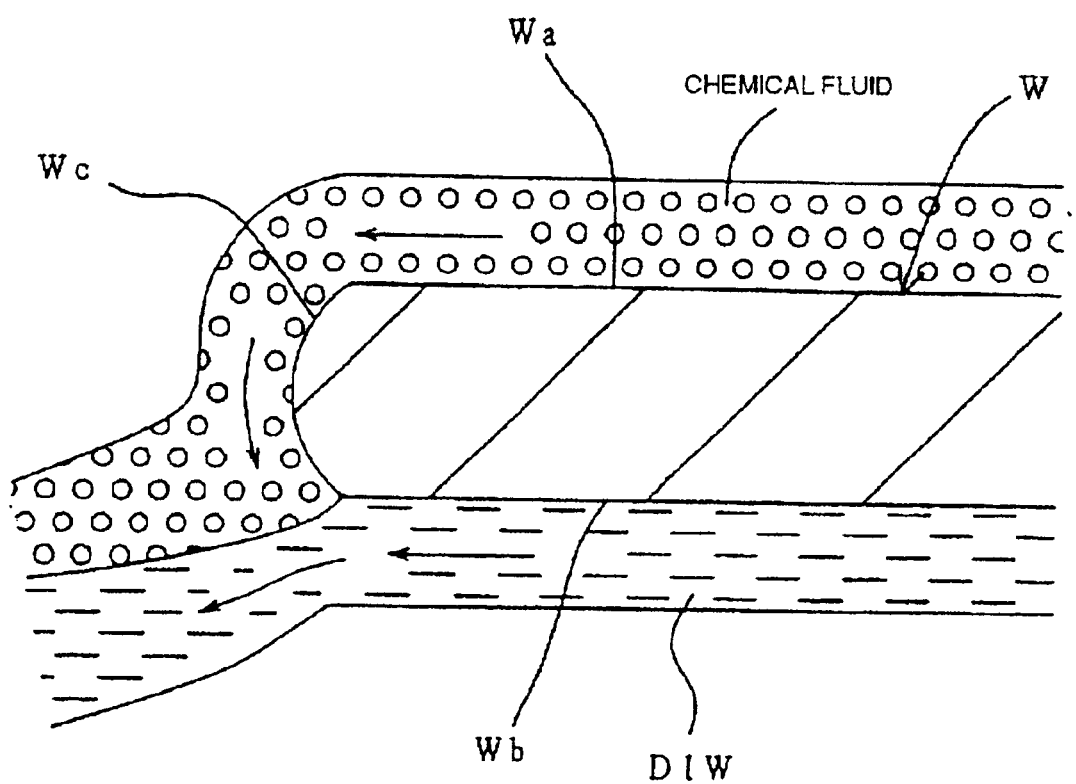
FIG. 6 is an enlarged front sectional view showing the mechanism for preventing the chemical fluids from flowing to the back face of the wafer by the injection and supply of purified water from the lower side injection nozzle in FIG. 3.
Figure 7A:
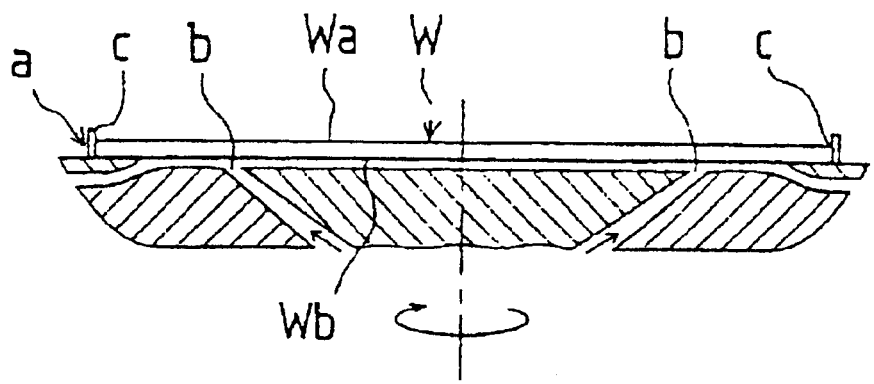
Figure 7B:
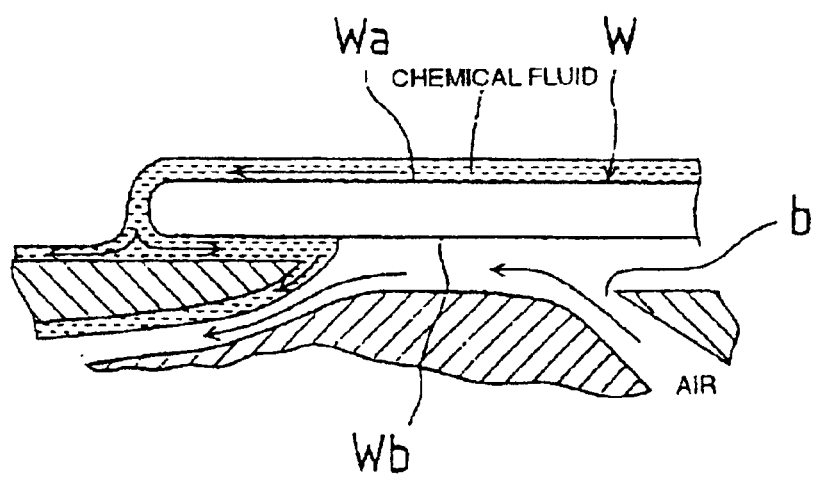

The Chemical Fluid Flowing Around Prevention Technique is described hereafter with reference to FIG. 6. The chemical fluids supplied to the front face Wa of the wafer W flow toward the outer peripheral portion Wc of the wafer W owing to the centrifugal force generated by the rotation of the wafer W, and are therefore prone to flow back to the back face from the outer peripheral portion Wc. However, the injection and supply of purified water to the back face Wb of the wafer W cleans the same while flowing in a radial direction along the back face Wb owing to the centrifugal force generated by the rotation of the wafer W and thereby isolates the chemical fluids which are prone to flow from the front face Wa to the back face Wb, thereby effectively preventing contamination of the back face Wb by the chemical fluids.

The inert gas supply section 6 supplies an inert gas for preventing oxidation toward the front and back faces of each wafer W which is rotatably supported by the wafer rotary section 2 and comprises, as major components, an upper side supply section 35 for supplying an inert gas to the front face Wa of each wafer W and a lower side supply section 36 for supplying inert gas to the back face Wb of each wafer, wherein these upper and lower side supply sections 35 and 36 can communicate with the inert gas supply source 37 provided outside the cleaning housing 1. In the illustrated preferred embodiment, the inert gas is a nitrogen gas (hereinafter, the "$N_2$ gas").

The inert gas supply section 5 supplies $N_2$ gas for preventing oxidation toward the front and back faces of each wafer W which is rotatably supported by the wafer rotary section 2 and comprises, as major components, an upper side supply section 35 for supplying $N_2$ gas to the front face of each wafer W and a lower side supply section 36 for supplying $N_2$ gas to the back face of each W, wherein these upper and lower side supply sections 35 and 36 can communicate with the inert gas supply source 37 provided outside the cleaning housing 1.

The upper side supply section 35 is provided at the upper portion of the cleaning housing 1 and comprises a circular cover body for forming a drying sealed space at the periphery of the front face Wa of each wafer W which is rotatably supported by the wafer rotary section 2 while cooperating with the cleaning chamber 3.

In detail, the outer diameter edge of the upper side supply section 35 is designed to closely engage with the inner diameter edge of the cleaning chamber 3, i.e., the outer diameter edge of the uppermost stage treatment bath 18, so that the requisite minimum drying sealed space is formed at the periphery of the front face Wa of each wafer W which is rotatably supported by the wafer rotary section 2. The upper side supply section 35 communicates with the inert gas supply source 37 via a pipe 38.

The upper side supply section 35 is vertically movable between the use position (not shown) cooperating with the cleaning chamber 3 and the use standby position, i.e., the position of height shown in FIG. 1 which does not interfere with the chemical fluid supply section 4, and is drivably connected to an elevating means, not shown.

The lower side supply section 36 is provided on the upper end portion of the rotatable rotary shaft 10 of the wafer rotary section 2. As shown in FIG. 4, the lower side supply section 36 is composed of the lower side injection nozzle 26 which is constructed in such a way as to likewise serve the purified water supply section 5, and an upper end gap 39 defined between the hollow inner periphery of the upper end portion of the rotary shaft 10 and the outer periphery of the pipe 30.

The lower side injection nozzle 26 is housed in the storage section 50, as set forth above, and communicates with the inert gas supply source 37 via the pipe 30 disposed inside the rotary shaft 10.

In particular, an inert gas supply passage (i.e., a pipe for supplying inert gas) 30b penetrates the interior of the pipe 30 and is arranged parallel to the purified water supply passages 30a, wherein the upper end of the inert gas supply passage 30b communicates with the storage section 50 of the lower side injection nozzle 26, and the lower end thereof can selectively communicate with the inert gas supply source 37 via a directional control valve 52.

The upper end gap 39 serving as another supply port of the lower side supply section 36 is positioned at and opens to a space 53 defined between the drainage receiver 31 and the wafer supporting section 11, as shown in FIGS. 2 and 4, and can selectively communicate with the inert gas supply source 37 via the directional control valve 52.

Through the inert gas supply section 6, the upper side supply section 35 thereof injects and supplies $N_2$ gas when the wafer W is cleaned and the chemical fluid inside the cleaning chamber 3 is drained or replaced with another chemical fluid.

Meanwhile, the lower side injection nozzle 26 of the lower side supply section 36 injects and supplies purified water from the purified water supply source 28 when the wafer W is cleaned, and injects and supplies $N_2$ gas in synchronization with the operation of the upper side supply section 35 at other times when the directional control valves 32 and 52 are switched.

Further, the upper end gap 39 of the lower side supply section 36 functions in the same manner as the upper side supply section 35, by injecting and supplying $N_2$ gas when the wafer is cleaned and the chemical fluid inside the cleaning chamber 3 is drained or replaced with another chemical fluid, so that any particles remaining in the space 53 defined between the drainage receiver 31 and the wafer supporting section 11 are purged and replaced by $N_2$ gas to maintain the positive pressure on the space 53, thereby effectively preventing the chemical fluids and purified water from leaking downward through the annular gap 45.

The controller 7 controls the movements of the components of the single wafer type substrate cleaning apparatus while interlocking with these components, thereby automatically effecting the following series of wet treatment steps:

(1) Prior to the application of the cleaning treatment, the wafer W is taken in the wafer supporting section 11 inside the cleaning chamber 3 via the wafer taking in/out port of the cleaning housing 1 (not shown), and after the cleaning chamber is sealed, the wafer W is placed in the cleaning treatment position inside the cleaning chamber 3 by the up and down movement of the cleaning chamber 3. Thereafter, the foregoing various cleaning treatments are effected in a predetermined procedure.

(2) For example, if the cleaning treatment is in the foregoing ii) cleaning treatment step (APM +DHF; DRY), the wafer W on the wafer supporting section 11 is first positioned and disposed in the lowermost stage treatment bath 15 and while the cleaning chamber 3 moves up and down the APM fluid is supplied from the upper side injection nozzles 25, and the spin cleaning treatment is applied to the wafer W as the wafer rotary section 2 rotates at low speed.

Purified water is injected and supplied from the lower side injection nozzle 26 to the back face Wb of the wafer W in synchronization with the spin cleaning treatment effected by the APM fluid, thereby cleaning the back face Wb of the wafer W and preventing the APM fluid from flowing to the back face Wb thereof.

(3) Subsequently, the wafer W is positioned and disposed in the second upper stage treatment bath 17, and purified water is injected and supplied from the upper side injection nozzles 25 while the rinsing treatment is applied to the wafer W as the wafer rotary section 2 rotates at low speed.

Also, in this case, purified water is injected and supplied from the lower side injection nozzle 26 to the back face Wb of the wafer W in synchronization with the rinsing treatment, thereby cleaning the back face Wb of the wafer W and preventing the rinsing water from flowing to the back face Wb of the wafer W.

(4) Further, the wafer W is positioned and disposed in the third upper stage treatment bath 16, and the DHF fluid is supplied from the upper side injection nozzle 25 while the spin cleaning treatment is applied to the wafer W as the wafer rotary section 2 rotates at low speed.

Purified water is injected and supplied from the lower side injection nozzle 26 to the back face Wb of the wafer W in synchronization with the spin cleaning treatment by the DHF fluid, thereby cleaning the back face Wb of the wafer W and preventing the DHF fluid from flowing to the back face Wb thereof.

(5) Further, the wafer W is positioned and disposed in the second upper stage treatment bath 17, and purified water is supplied from the upper side injection nozzle 25 while the rinsing treatment by purified water is applied to the wafer W as the wafer rotary section 2 rotates at low speed, and purified water is injected and supplied from the lower side injection nozzle 26 to the back face Wb of the wafer W, thereby cleaning the back face Wb of the wafer W and preventing the rinsing water from flowing from the front face Wa of the wafer W to the back face Wb thereof.

(6) Finally, the wafer W is positioned and disposed in the uppermost stage treatment bath 18, while $N_2$ gas is injected from the upper side supply section 35 and the lower side supply section (i.e., the lower side injection nozzle 26) of the inert gas supply section 6, and the spin drying treatment is applied to the wafer W as the wafer rotary section 2 rotates at high speed.

In the drying step, the upper side supply section 35 of the inert gas supply section 6 is lowered to the use position while cooperating with the cleaning chamber 3, so that it forms a drying sealed space while cooperating with the cleaning chamber 3, and thereafter $N_2$ gas is supplied to and fills the drying sealed space.

Accordingly, when contents of the drying sealed space A are purged and replaced by the $N_2$ gas, or, when occasion demands, air current is produced in the passage extending from the inert gas supply section 6 to the drain section inside the drying sealed space owing to the forceful air discharge from the drain section of the uppermost stage treatment bath 18, the concentration of oxygen on the periphery of the entire front face Wa of the wafer W becomes substantially zero (0), and thereafter the spin drying treatment is applied to the wafer W.

(7) The wafer W is again taken out via the wafer taking in/out port of the cleaning housing 1 upon completion of a series of cleaning treatments in the single wafer type cleaning apparatus.

Under the single wafer type substrate cleaning apparatus having the foregoing construction, a plurality of chemical fluids is sequentially supplied vertically from the upper side injection nozzles 25 to the front face Wa of a single wafer W which is rotatably supported in the sealed cleaning housing 1 so as to wet-clean it, while purified water is injected and supplied from the lower side supply 26 to the back face Wb of the wafer W when the wet-cleaning treatment is applied to the front face Wa thereof, thereby cleaning the back face Wb and preventing the chemical fluids from flowing to the back face Wb of the wafer W.

In other words, owing to the centrifugal force generated by the rotation of the wafer W, the chemical fluids supplied to the front face Wa of the wafer W flow toward the outer peripheral portion of the wafer W and they are prone to flow from the outer peripheral portion of the wafer W to the back face Wb thereof. Accordingly, as the front face Wa of the wafer W is cleaned by chemical fluids, purified water is injected and flows in a radial direction along the back face Wb of the wafer W owing to the centrifugal force generated by the rotation of the wafer W, thereby cleaning the back face Wb, and provides a sealing function relative to the chemical fluids which are prone to flow from the front face Wa to the back face Wb, thereby effectively preventing contamination of the back face Wb of the wafer W by the chemical fluids.

Although the foregoing embodiment is the preferred embodiment of the invention, the invention is not limited thereto but can be redesigned and modified within the scope of the invention.

For example, the single wafer type cleaning apparatus can be used as a single apparatus, or as a basic construction element of a wafer cleaning system provided with a loading section, an unloading section or other types of equipment such as placing and mounting robots and the like.

Further, the chemical fluids employed by the embodiment are merely samples, and hence other chemical fluids such as HPM ($HCL+H_2O_2+H_2O$), SPM ($H_2SO_4+H_2O_2+H_2O$) and the like can be used depending on the object thereof.

Further still, in the illustrated embodiment, purified water supply passages $30a$, $30a$, ... which communicate with the lower side injection nozzle 26 may be constructed in such a manner as to communicate either with the purified water supply source 28 or the chemical fluid supply source 27 via the directional control valve 32, thereby applying either the single side cleaning treatment to the front face Wa of the wafer W as illustrated in the drawings or dual side cleaning treatment to the wafer W, i.e., the front face Wa and back face Wb of the wafer W.

What is claimed is:

1. A single wafer substrate cleaning method for wet-cleaning wafers, which are not stored in a cassette, individually in a sealed cleaning housing, said method comprising the steps of:

rotating a wafer in a substantially horizontal plane in the sealed cleaning housing, and injecting purified water upwardly from a lower side supply nozzle toward a back face of the wafer, said purified water being injected at rates which are minimal toward the radial center of said wafer and which increase progressively toward the periphery of said wafer, whereby the injected and supplied purified water cleans the back face of the wafer as it is conducted in a radial direction along the back face thereof.

2. The single wafer substrate cleaning method according to claim 1 further including the step of sequentially supplying from above a plurality of chemical fluids from upper side supply nozzles to a front face of the wafer.

3. The single wafer substrate cleaning method according to claim 2 further including the steps of:

providing a cleaning chamber having plural stages of annular treatment baths, and moving the cleaning chamber vertically with respect to the rotating wafer for sequentially suppling fluids to the wafer.

4. The single wafer substrate cleaning method according to any one of claims 1 to 3 wherein the injection of purified water from the lower side supply nozzle causing the wafer to float owing to a force of injection and owing to centrifugal forces generated by rotation of the wafer conducts the purified water toward an outer peripheral portion of the wafer along the back face thereof.

* * * * *